United States Patent [19]
Akamatsu et al.

[11] Patent Number: 5,396,096
[45] Date of Patent: Mar. 7, 1995

[54] SEMICONDUCTOR DEVICE AND MANUFACTURING METHOD THEREOF

[75] Inventors: Susumu Akamatsu; Atsuhiro Kajiya, both of Osaka, Japan

[73] Assignee: Matsushita Electric Industrial Co., Ltd., Osaka, Japan

[21] Appl. No.: 132,323

[22] Filed: Oct. 6, 1993

[30] Foreign Application Priority Data

Oct. 7, 1992 [JP] Japan ................. 4-268408

[51] Int. Cl.6 ................. H01L 29/78; H01L 21/265
[52] U.S. Cl. ................. 257/336; 257/344;
257/357; 257/373; 257/376; 257/408; 257/544;
257/547; 437/34; 437/45; 437/56; 437/74;
437/913
[58] Field of Search ................ 257/336, 344, 408, 357,
257/373, 376, 544, 547; 437/45, 34, 56, 74, 913

[56] References Cited

U.S. PATENT DOCUMENTS 5,144,389 9/1992 Nakamura et al. ................. 257/336

FOREIGN PATENT DOCUMENTS 2-25672 1/1990 Japan .

Primary Examiner—Edward Wojciechowicz
Attorney, Agent, or Firm—Willian Brinks Hofer Gilson & Lione

[57] ABSTRACT

In a semiconductor device, a FET and an isolation are provided on a semiconductor substrate and a channel stop region is provided under the isolation. At least a region to which a high voltage is applied of a source region and a drain region of the FET is separated from the channel stop region, and a first buffer region doped with an impurity for adjusting the threshold level is provided therebetween. A region under a gate electrode and adjacent to the isolation serves as a second buffer region to which an impurity for adjusting the threshold level is doped. With the first buffer region, a depletion region at a boundary of the drain region and the channel stop region is ensured, obtaining a superior durability to high voltage of the source/drain region. With the second buffer region, leakage current between the source region and the drain region is prevented.

21 Claims, 15 Drawing Sheets

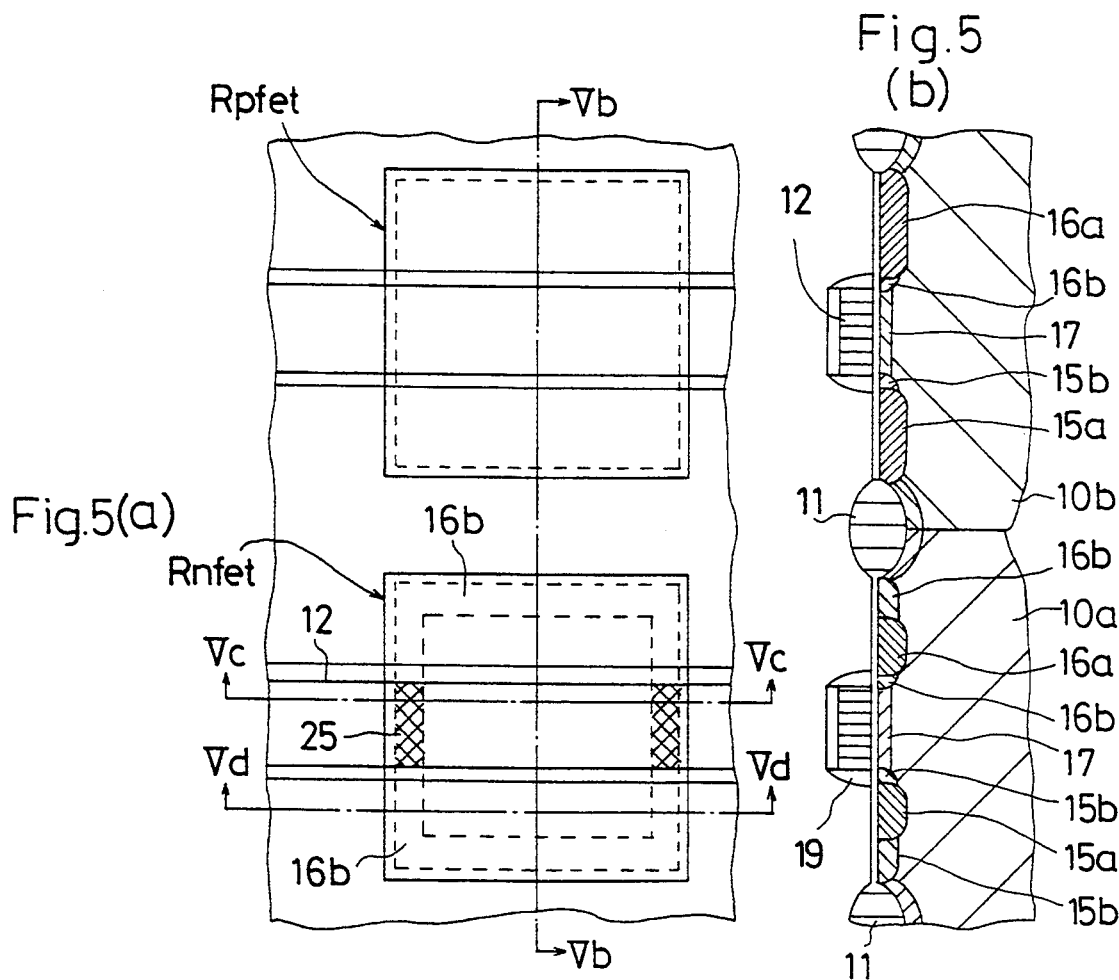
Fig.5
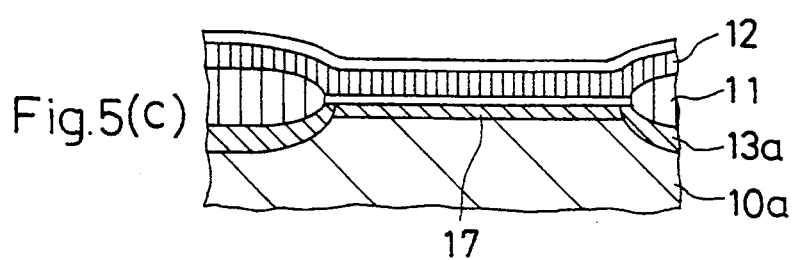
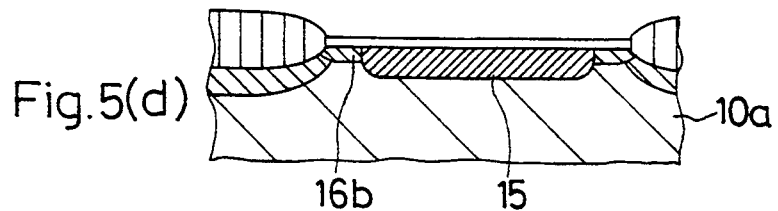

Fig.11(a) I1
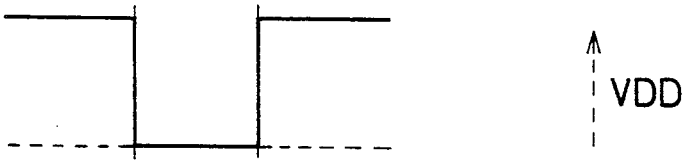
Fig.11(b) I1'
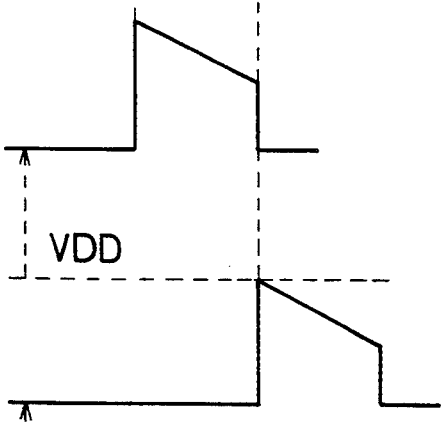
Fig.11(c) A
Fig.11(d) A'
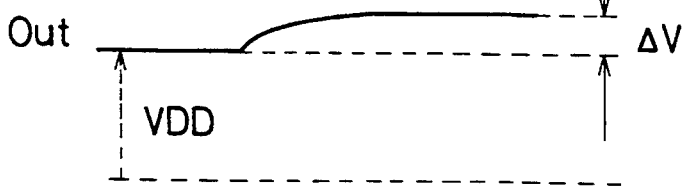
Fig.11(e)

Prior Art
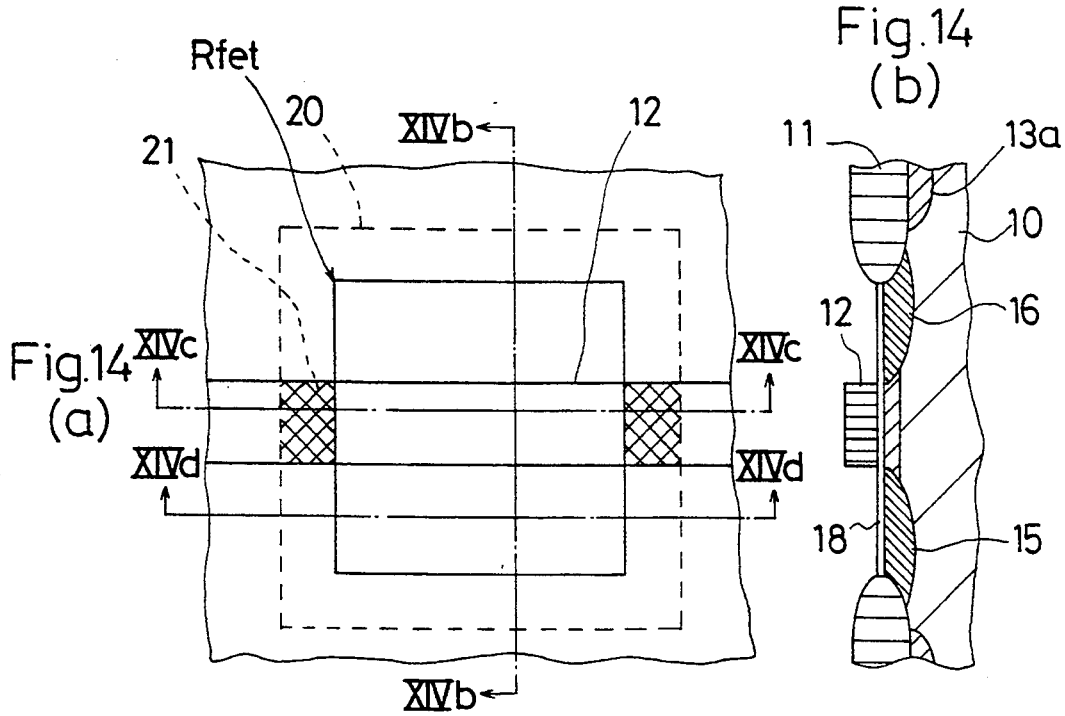
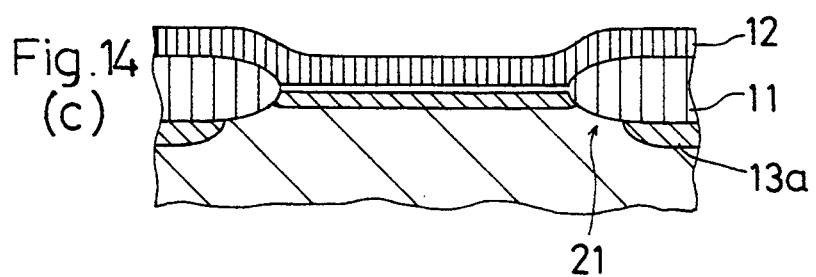
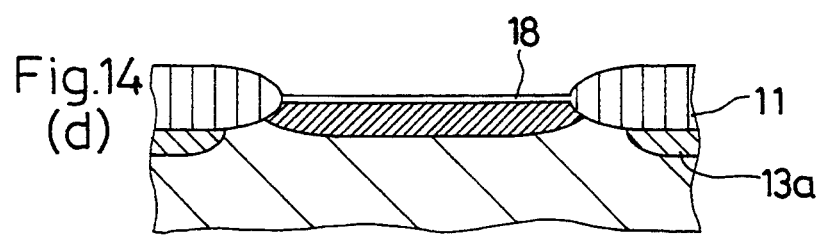

Prior Art

SEMICONDUCTOR DEVICE AND MANUFACTURING METHOD THEREOF

BACKGROUND OF THE INVENTION

This invention relates to a construction of a semiconductor device having a field-effect transistor (hereinafter referred to it as FET), and a manufacturing method thereof.

A conventional semiconductor device having a FET (especially, MOSFET having a gate insulating Film) is shown in FIG. 12. In detail, a gate electrode 12 is provided on a silicon substrate 10 of a conductive type via a gate insulating film. A gate region 17 to which an impurity for adjusting threshold, namely an impurity of the same conductive type as that of the silicon substrate 10 is doped, is formed under the gate electrode 12 in the silicon substrate 10. A drain region 16 and a source region 15 are doped with an impurity of an inverse conductive type to that of the silicon substrate 10 and are formed on sides of the gate electrode 12 in the silicon substrate 10. Under such a construction, a current between source and drain is adjusted according to a bias voltage to the gate electrode 12. Each isolation 11 such as LOCOS is provided so as to electrically insulate a region Rfet at which the MOSFET is to be formed from other regions. Further, a channel stop region 13a to which an impurity is doped is provided under the isolation 11 to ensure the characteristic of isolation.

FIGS. 13(a)–(e) show a manufacturing process of an n-channel MOSFET of such FETs.

First, as shown in FIG. 13(a), a silicon nitride layer 31 open to a region 31a at which an isolation is to be formed is formed on a p-type silicon substrate 10 (or p-well), and a p-type impurity (boron, or the like) for forming the channel stop region is implanted.

Next, as shown in FIG. 13(b), the isolation 11 made of LOCOS is formed at the open part 31a of the silicon nitride layer 31 by thermal oxidation. At this time, the p-type impurity which is previously implanted is diffused to form the channel stop region 13a.

Then, as shown in FIG. 13(c), after removing the silicon nitride layer 31, a silicon oxide layer 33 is formed on the silicon substrate 10 and phosphorous, as an impurity for adjusting threshold, is implanted thereover. Wherein, the region at which other elements such as the p-channel MOSFET are to be formed is covered with a photoresist mask.

Then, as shown in FIG. 13(d), after removing the silicon oxide layer 33, a clean gate insulating film 18 (silicon oxide layer or double layer of silicon oxide layer and silicon nitride layer) is formed and a gate electrode 12 made of polysilicon is formed thereon.

Then, as shown in FIG. 13(e), an impurity, whose density is high, of the inverse conductive type to the silicon substrate 10, e.g. arsenic, is implanted to form a source region 15 and a drain region 16, using, as masks, the gate electrode 12 and a photoresist mask 32 open to a region surrounded by the isolation 11.

When the isolation 11 is wide and thick enough in such a MOSFET which is not so highly integrated, the impurity density of the channel stop region 13a is not necessarily so high, and about $5 \times 10^{16} \text{cm}^{-3}$ is enough impurity density to obtain an excellent characteristic of element isolation. However, isolation becomes narrower accompanied by high-density elements, so that growth of the thick oxide layer in the narrower isolation is difficult and unfavorable in view of reduction of step difference. The oxide layer of the isolation should be thin. However, such a thin oxide layer of the isolation makes the isolation characteristic lowered unless the impurity density of the channel stop region 13a is high. For example, with 0.6 μ isolation width and oxide layer of 300 nm thickness, the impurity density of the channel stop region 13a must be higher than about $1 \times 10^{17} \text{cm}^{-3}$ to ensure the characteristic of isolation. When the impurity density is about $5 \times 10^{16} \text{cm}^{-3}$ a durability to high voltage at a boundary between the channel stop region 13a (p-type) and the drain region 16 (n-type), i.e. a P-N junction part is not lowered. However, when the impurity density of the channel stop region 13a is about $1 \times 10^{17} \text{cm}^{-3}$ the durability to high voltage at the P-N junction part is lowered because a depletion region is prevented from dispersion.

In order to solve this problem, Japanese Patent Application Laying Open Gazette No.3-283574 discloses a construction shown in FIGS. 14(a)–(d). FIG. 14(a) is a plan view of the semiconductor device, FIGS. 14(b), (c) and (d) are respectively sections taken along lines XIVb—XIVb, XIVc—XIVc and XIVd—XIVd. Each figure shows that the channel stop region 13a is offset to a side of the isolation 11 by a set distance from the isolation 11, instead of the channel stop region 13a having comparatively high impurity density being provided on the whole region under the isolation 11. In other words, an offset region 20 having low impurity density over a set width is formed between the end part of the isolation 11 and the channel stop region 13a. In this way, by providing the offset region 20 of low impurity density, the dispersion of depletion region and the durability to high voltage at the P-N junction part are ensured.

Another proposal is disclosed in, for example, Japanese Patent Application Laying Open Gazette No.2-15672 as shown in FIGS. 15(a)–(d). FIG. 15(a) is a plan view of the semiconductor device, FIG. 15(b),(c) and (d) are respectively sections taken along lines XVb—XVb, XVc—XVc and XVd—XVd. Each figure shows that a part 22 adjacent to the drain region 16 of an overlap region 21 where the isolation 11 and the gate electrode 12 overlap each other is a part of the offset region 20 to which an impurity is lightly doped. Wherein, a part 23 adjacent to the source region 15 of the overlap region 21 is not a part of the offset region 20 but a part of the channel stop region 13a to which an impurity is comparatively-lightly doped.

The above semiconductor devices, however, have following problems.

Referring to the construction according to the former reference, in FIG. 14(c), at the overlap region 21 between the isolation 11 and the gate electrode 12, the low-density impurity (e.g. boron of p-type impurity in n-channel FET) in the offset region 20 is diffused into the isolation 11 to lower the density of a face-boundary of the offset region 20 when thermal oxidation of silicon is conducted to form the isolation 11. When an inversion layer is generated because of further lowering of the impurity density of the offset region 20, a leakage current may occur between the drain region 16 and the source region 15 via the overlap region 21. Also, in the process, a side wall spacer must be provided at each side wall of the silicon nitride layer 31 for forming LOCOS in order to form the offset region 20 (refer to FIG. 2(c) in the reference), which needs two additional steps for forming and removing the side wall spacer.

Referring to the latter reference, in the overlap region 21 where the end part of the isolation 11 and gate electrode 12 overlap each other, the channel stop region 13a is extended to a part 23 excepting a part 22 adjacent to the drain region 16, so that the inversion layer at the part 23 is prevented and the leakage current between drain and source is also prevented.

In this case, however, as well as in the case of the former reference, since the channel stop region 13a is formed in such a shape, a photoresist mask having a special shape must be formed, which needs an additional step. Further, in order to define the part 22 adjacent to the drain region 16 and the part 23 adjacent to the source region 15 in the overlap region 21 where the end part of the isolation 11 and the gate electrode 12 overlap each other, a mask for patterning the silicon nitride layer and a mask for forming the gate electrode must be aligned accurately. However, the gate electrode is getting narrower and narrower in width accompanied by micro-fabrication of transistor, which results in difficult alignment.

SUMMARY OF THE INVENTION

The present invention has as its object providing a low cost semiconductor device suitable for high integration and a manufacturing method thereof by providing means for ensuring the durability to high voltage between the channel stop region and the drain region, without the additional steps, difficult alignment, and leakage current in the overlap region between the isolation and the gate electrode as known in the priority.

To attain the above object, in the present invention, a semiconductor device having a FET in an element forming region of a semiconductor substrate to which an impurity of a conductive type is doped, comprises:

a gate electrode of the FET which is formed on the semiconductor substrate;

a source region and a drain region of the FET which are provided under both sides of the gate electrode in the semiconductor substrate, and to which an impurity of an inverse conductive type to that of the semiconductor substrate is doped;

an isolation formed around the element forming region on the semiconductor substrate so as to isolate the element forming region from other regions;

a channel stop region formed under the isolation in the semiconductor substrate, an impurity of a same conductive type as that of the semiconductor substrate being doped to the channel stop region;

a first buffer region formed between the channel stop region and at least a region to which a high voltage is applied of the drain region and source region in the semiconductor substrate, an impurity of the same conductive type or the inverse conductive type being doped to a density of threshold adjusting level to the first buffer region; and a second buffer region formed under the gate electrode in the semiconductor substrate and adjacent to the isolation, the impurity of the same conductive type or the inverse conductive type being doped to a density of threshold adjusting level to the second buffer region.

Accordingly, the first buffer region to which the impurity for adjusting the threshold level is doped forms a set space between the channel stop region and the source region or the drain region. Therefore, the depletion region is ensured at a boundary of the channel stop region and the source region or the drain region with excellent durability to high voltage, even though the impurity density of the channel stop region is high. Consequently, in a FET having fine dimension, the characteristic of isolation is ensured with high impurity density of the channel stop region, and the excellent durability to high voltage of the source region and the drain region is also ensured. Since the region adjacent to the isolation under the gate electrode is the second buffer region doped with an impurity having the density of the threshold adjusting level, no inversion layer due to low impurity density is generated, thus preventing leakage current between source and drain. In addition, with the above construction, no additional manufacturing steps are necessary, compared with that of a conventional semiconductor device, and the alignment is easy because of the self-alignment at the gate electrode.

The above construction can be applied to a semiconductor device having a FET of LDD type provided with side wall spacers at both sides of the gate electrode, a lightly doped a source region, lightly doped drain region, a heavily doped source region and the heavily doped drain region. In this case, the lightly doped source region or the lightly doped drain region is provided between the channel stop region and the heavily doped source region or the heavily doped drain region so as to serve as the first buffer region. Thereby, short channel effect can be reduced, which means the semiconductor device suitable for micro-fabrication.

When the first buffer region is provided between the channel stop region and a region of the drain region and the source region in the semiconductor substrate, the semiconductor device is suitable for the case where high voltage is applied to both the source region and the drain region.

With a semiconductor device having a step-up transformer, the source region or the drain region of the FET which is separated from the channel stop region by the first buffer region is connected to a high potential part of the step-up transformer.

When a punch-through stop region is provided deeper in the element forming region of the semiconductor substrate, the same impurity as that in the channel stop region is doped to the punch-through stop region and the punch-through stop region is formed so as to continue to the channel stop region and separate from at least a region to which high voltage is applied of the source region and the drain region. Thereby, the punch-through region and the channel stop region are concurrently formed, reducing the number of manufacturing steps.

A method of manufacturing a semiconductor device having an isolation for isolating the element forming region from other regions and a FET composed of a gate electrode, a source region and a drain region in an element forming region of a semiconductor substrate to which an impurity of a conductive type is doped, comprises the steps of:

doping an impurity for forming a channel stop to a region where the isolation of the semiconductor substrate is to be formed;

forming an insulating film to be the isolation at the isolation forming region on the semiconductor substrate;

doping an impurity of a same conductive type as or an inverse conductive type to that of the semiconductor substrate to a density of threshold adjusting level to the element forming region;

forming the gate electrode of the FET on the element forming region; and forming the source region and the drain region of the FET by doping an impurity of an inverse conductive type to the that of the semiconductor substrate to both sides of the gate electrode of the element forming region, wherein the step of forming the drain region and the source region is conducted so that at least a region to which a high voltage is applied of the drain region and the source region is formed set-distance inside of the element forming region from an end part of the isolation, separating from a channel stop region.

In the above method, after the isolation surrounding the element forming region of the FET and the channel stop region thereunder are formed, the impurity, of the same conductive type as or the inverse conductive type to that of the semiconductor substrate, for adjusting threshold is doped to the element forming region as a whole. Then, the gate electrode, source region and the drain region are formed. At least a region to which a high voltage is applied of the source region and the drain region is formed set-distance inside of the element forming region from the isolation, separating from the channel stop region, so that the first buffer region to which the impurity for adjusting threshold is doped is provided between the isolation and the source region or the drain region. Also, the second buffer region to which the impurity for adjusting threshold is doped is provided under the gate electrode and at a region adjacent to the element forming region. Compared with a manufacturing method of a conventional semiconductor device having a FET, no additional step is needed. Further, easy alignment is realized since the mask pattern used for forming the source region or the drain region is different only at a part with respect to the isolation and a part at the gate electrode is self-aligned. Thus, the semiconductor device is easily manufactured with low cost.

The above manufacturing method can be applied to that of a semiconductor device basically having the LDD structure. In this case, after forming the gate electrode, the lightly doped source region and the lightly doped drain region are formed by doping lightly an impurity of the inverse conductive type. Then, after the side wall spacer is provided to the gate electrode, the heavily doped drain region and the heavily doped source region are formed by doping heavily an impurity of the inverse conductive type. At this time, the channel stop region is separated from the heavily doped drain region or the heavily doped source region. According to this method, the lightly doped drain region or the lightly doped source region is provided between the channel stop region and the heavily doped drain region or the heavily doped source region, serving as the first buffer region. The number of the manufacturing steps in this method is the same as that in a conventional method, which means an easy, low-cost manufacturing method.

In a semiconductor device having an n-channel FET and a p-channel FET, the above manufacturing method is applied to form the source region or the drain region of at least the n-channel FET. Because, this comparatively facilitates the manufacturing steps with excellent characteristic of the device since the inversion layer in the channel stop region is hard to be generated in the p-channel FET.

The above manufacturing method may be applied to form the source region or the drain region in both the n-channel FET and the p-channel FET.

Two processes for doping the impurity to the source region and the drain region are possible in the above manufacturing method.

One process is that: an impurity ion is implanted, using, as masks, a photoresist mask and the gate electrode. Compared with a general method, only required is to change the pattern of the photoresist mask.

The other process is that: the electrode, made of a conductive material, to which an impurity to be implanted is doped is formed in the source region and the drain region (heavily doped source region or heavily doped drain region in the LDD structure), and the impurity is diffused into the semiconductor substrate by heating. According to this process, the impurity is doped not so deep and punch-through is prevented.

Further, in case where the punch-through stop region is provided deeper than the element forming region, after forming the isolation, the impurity of the same conductive type is implanted thereover with high energy to concurrently form the channel stop region and the punch-through stop region. Thus, the manufacturing step is reduced in number.

BRIEF DESCRIPTION OF THE DRAWINGS

FIG. 5(a) is a plan view of a semiconductor device according to a third embodiment.

FIGS. 5(b)–(d) are respectively sections taken along lines Vb—Vb, Vc—Vc and Vd—Vd in FIG. 5(a).

FIGS. 11(a)–(e) are respectively waveform charts of respective voltage signals of terminals I1, I1', points A, A' and a terminal Out of the step-up transformer in the sixth embodiment.

FIG. 14(a) is a plan view showing a vicinity of a FET of a conventional semiconductor device disclosed in a reference.

FIGS. 14(b)-(d) are respectively sections taken along lines XIVb—XIVb, XIVc—XIVc and XIVd—XIVd in FIG. 14(a).

DETAILED DESCRIPTION OF PREFERRED EMBODIMENTS

Preferred embodiments of the present invention are described below.

(FIRST EMBODIMENT)

The first embodiment is discussed first, with reference to FIGS. 1(a)-(d) and FIGS. 2(a)-(e).

Figure 1:
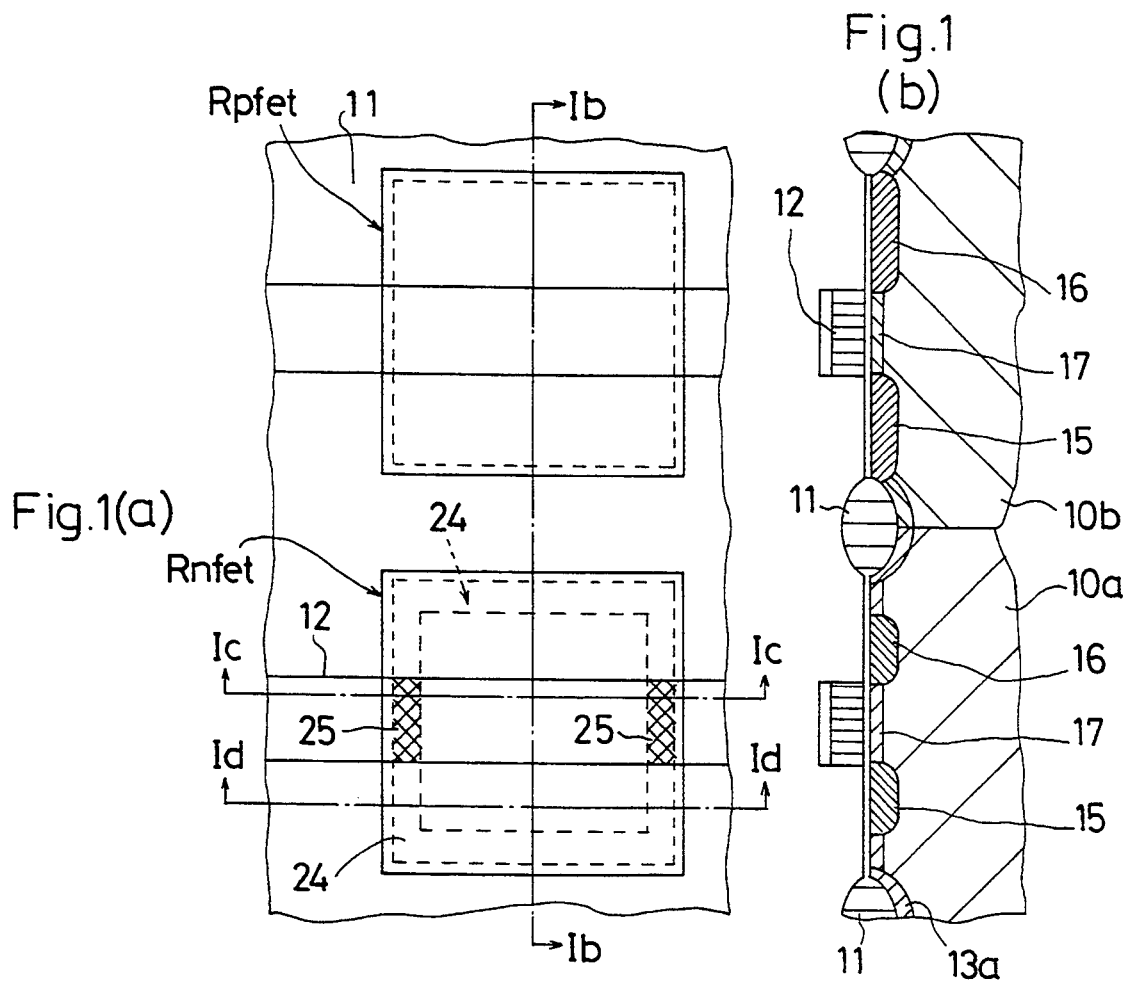
FIG. 1(a) is a plan view of a semiconductor device according to a first embodiment.
FIGS. 1(b)–(d) are respectively sections taken along lines Ib—Ib, Ic—Ic and Id—Id in FIG. 1(a).

FIGS. 1(a)-(d) show a construction of a CMOSFET according to the first embodiment, wherein FIG. 1(a) is a plan view, FIGS. 1(b)-(d) are respectively sections taken along lines Ib—Ib, Ic—Ic and Id—Id. An n-channel MOSFET 1 and a p-channel MOSFET 2 (both surface channel MOSFETs) are arranged in the semiconductor device. In an upper part of a silicon substrate 10, a P-well 10a and an N-well 10b are respectively formed in an element forming region Rnfet where the n-channel MOSFET 1 is to be formed and an element forming region Rpfet where the p-channel MOSFET 2 is to be formed. A gate insulating film 18 of silicon oxide layer is provided on each well 10a, 10b, and a gate electrode 12 of double layer of polysilicon layer and silicon oxide layer is provided on the gate insulating film 18. A gate region 17, to which an impurity for adjusting threshold (in this case, impurity of same conductive type as each well) is doped, is formed in the silicon substrate 10 (well) under the gate electrode 12. In other words, boron as a p-type impurity and phosphorus as an n-type impurity are comparatively lightly doped to the respective gate regions 17 in the n-channel MOSFET 1 and the p-channel MOSFET 2. Wherein, boron of p-type impurity is implanted in the case without the surface channel p-MOSFET. A source region 15 and a drain region 16 to which impurities of inverse conductive type to the respective wells, i.e. arsenic in the n-channel MOSFET 1 and boron in the p-channel MOSFET 2 are heavily doped are provided at both side ends of the gate region 17.

An isolation 11 made of LOCOS is provided around the element forming regions Rnfet, Rpfet of each MOSFET 1, 2 for electrically insulating the element forming regions Rnfet, Rpfet from other regions. A channel stop region 13a is provided in a region under the isolation 11 for ensuring the characteristic of isolation, wherein an impurity of inverse conductive type to that of the source and drain regions, namely of the same conductive type that of as the respective wells is doped to the channel stop region 13a.

Features of the present invention are described. In the n-MOSFET 1, the source and drain regions 15, 16 are formed in a region set-distance inside from an end part of the isolation 11 without contact with the channel stop region 13a. In other words, a first buffer region 24, to which an impurity (for adjusting threshold) of same conductive type as and of equal density to that of the gate region 17 is doped, is provided between the source and drain regions 15, 16 and the channel stop region 13a. The impurity for adjusting threshold is doped to a region (second buffer region 25) under the gate electrode 12 and adjacent to the isolation 11. The impurity density near a surface of each buffer regions 24, 25 is about $10^{16}$–$10^{17}$cm$^{-3}$.

In the p-MOSFET 2, both the source region 15 and the drain region 16 are overlapped with the end of the isolation 11, i.e. the channel stop region 13a, which means no buffer region.

A method of manufacturing the semiconductor device according to the first embodiment is discussed next, with reference to FIGS. 2(a)-(e). In FIGS. 2(a)-(e), the left side shows a section of the n-MOSFET 1 and the right side shows a section of the p-MOSFET 2.

Figure 2:
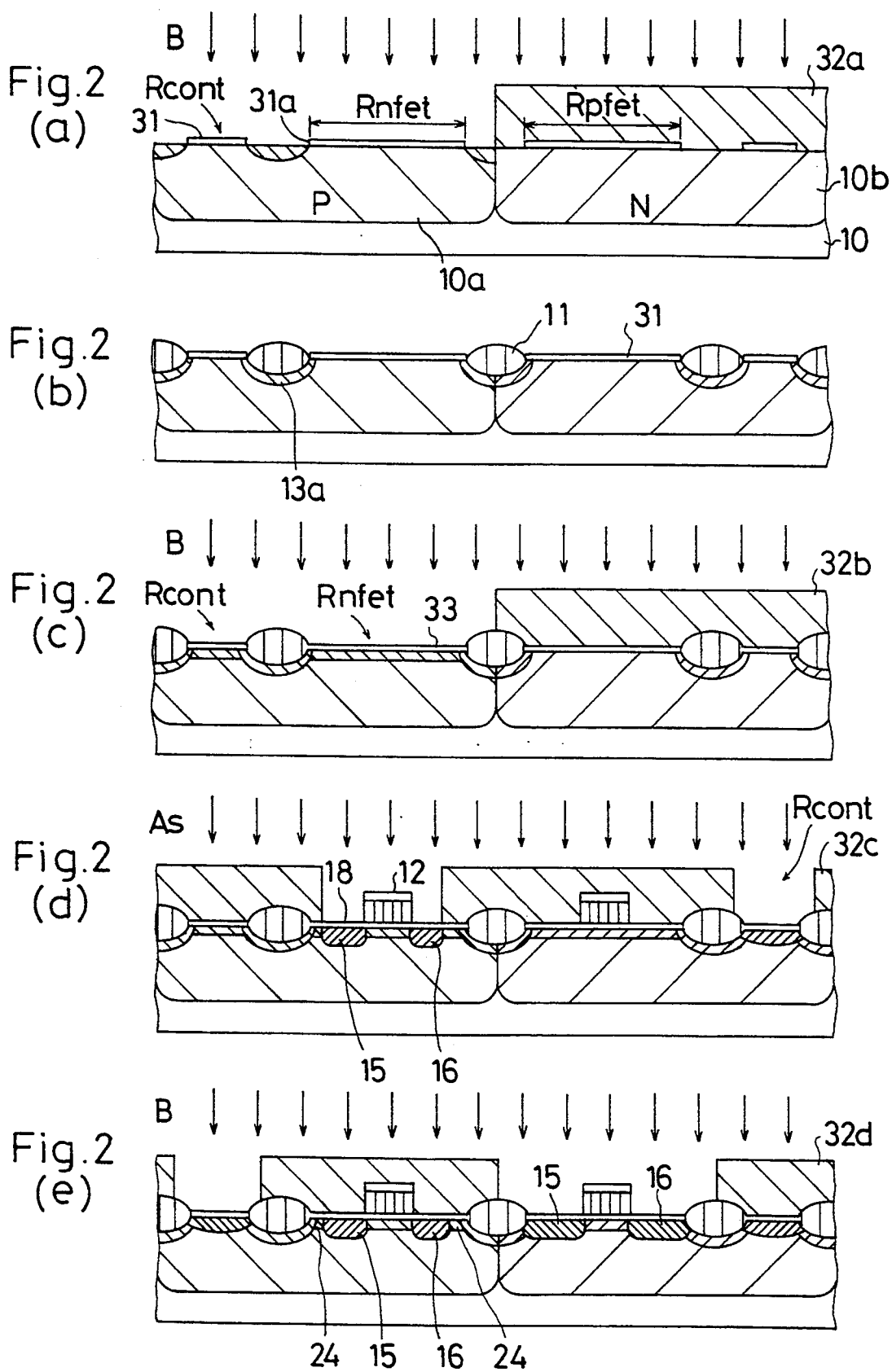
FIGS. 2(a)–(e) are respectively sections at respective steps for manufacturing the semiconductor device in the first embodiment.
Figure 3:
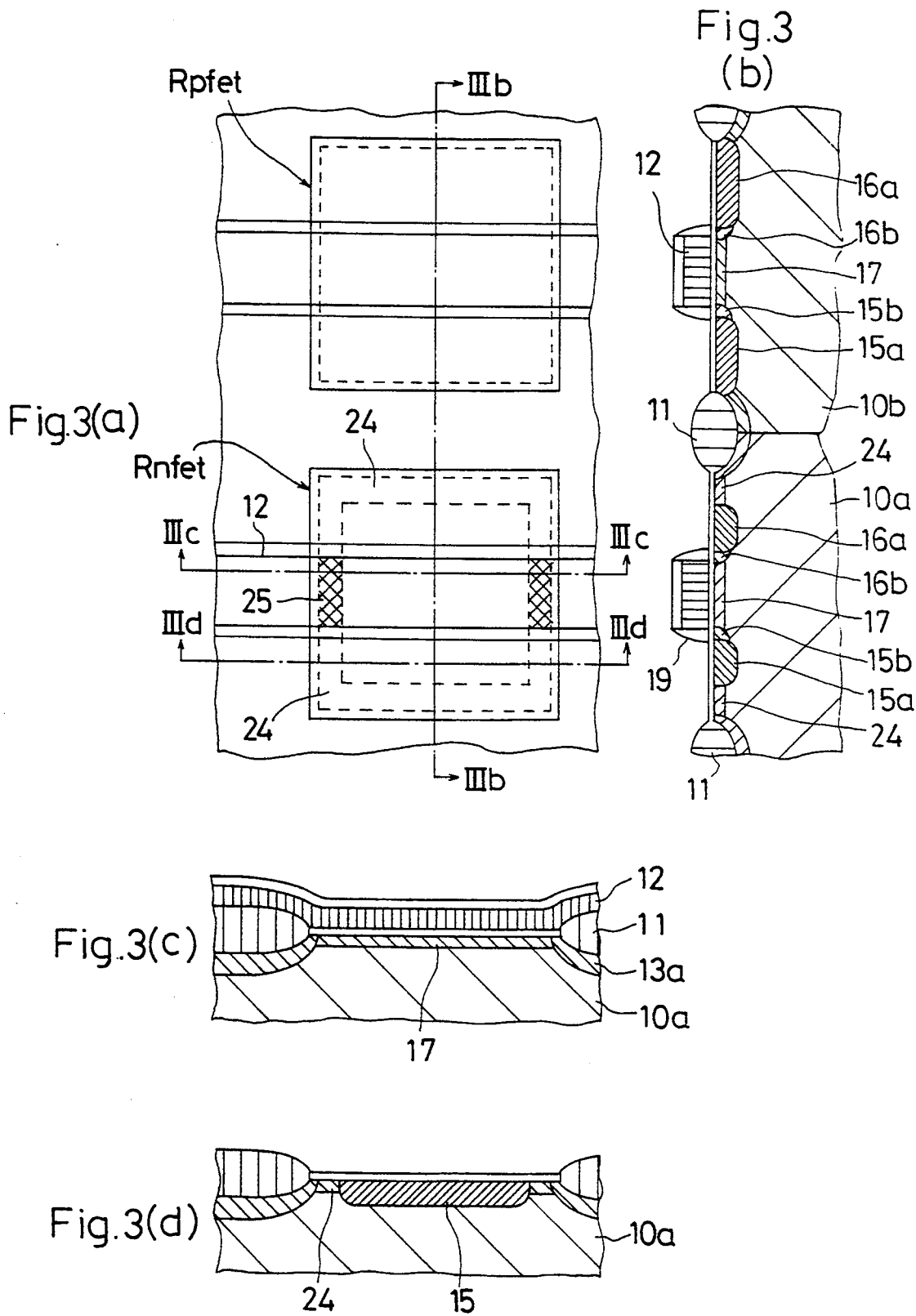
FIG. 3(a) is a plan view of a semiconductor device according to a second embodiment.
FIGS. 3(b)–(d) are respectively sections taken along lines IIIb—IIIb, IIIc—IIIc and IIId—IIId in FIG. 3(a).

As shown in FIG. 2(a), the P-well 10a and the N-well 10b are formed at a surface of the silicon substrate 10. After a silicon nitride layer 31 having a pattern open to a region 31a where the isolation is to be formed is formed thereon, a photoresist mask 32a for covering the element forming region Rpfet of the p-MOSFET 2 is fabricated. Then, in the element forming region Rnfet and the contact forming region Rcont of the n-MOSFET 1, over the photoresist mask 32a, boron (B) as a p-type impurity for forming channel stop region is implanted in an open part 31a of the silicon nitride layer 2. Phosphorus (P) as an n-type impurity for forming channel stop region is implanted in the p-MOSFET 2, as well (not shown).

As shown in FIG. 2(b), the isolation 11 of LOCOS is formed by thermal-oxidation of the silicon at the opening part 31a of the silicon nitride layer 31. At this time, the impurity which is already implanted is diffused by the high-temperature treatment, so that the channel stop region 13a is formed over a whole region under the isolation 11.

Then, as shown in FIG. 2(c), after removing the silicon nitride layer 31, a silicon oxide layer 33 is formed, a photoresist 32b for covering the p-MOSFET 2 is formed, then boron (B) as an impurity for adjusting threshold of the n-MOSFET 1 is implanted thereover. At this time, the impurity density near the surface of each buffer regions 24, 25 is about $10^{16}$–$10^{17}$cm$^{-3}$ with acceleration energy of 20-50 KeV. Phosphorus (P) as the impurity for adjusting threshold is implanted in a region for forming the p-MOSFET 2 (not shown).

Next, as shown in FIG. 2(d), a photoresist mask 32c open to the source and drain regions of the n-MOSFET 1 and the contact forming region Rcont of the p-MOSFET 2 is formed, then arsenic (As) as an n-type impurity is heavily implanted thereover. At this time, the photoresist mask 32c is formed so as to cover a part set-distance inside of the element forming region Rnfet from the end part of the isolation 11 in the n-MOSFET 1. As a result, the source region 15 and the drain region 16 are separated from the channel stop region 13a. At this implanting step, the gate electrode 12 also functions as a mask. Thereby, the source region 15 and the drain region 16 are patterned by the self-alignment.

Next, as shown in FIG. 2(e), a photoresist mask 32d open to the source and drain forming regions of the p-MOSFET 2 and the contact forming region Rcont of the n-MOSFET 1 is formed, and boron (B) as the p-type impurity is heavily implanted thereover.

Consequently, in the first embodiment, the drain region 16 is separated from the channel stop region 13a under the isolation 11 in the n-MOSFET 1. In detail, since the first buffer region 24 to which the impurity for adjusting threshold (boron(B)) is adequately lightly implanted is provided between the channel stop region 13a and the drain region 16, the depletion region is ensured, thus obtaining excellent durability to high voltage, though the density of the impurity (boron (B)) of the channel stop region 13a is more than about $1 \times 10^{17} cm^{-3}$.

In detail, the high impurity density of the channel stop region 13a prevents the generation of the inversion layer in the elements required for micro-fabrication such as a memory region. On the other hand, in the elements where high voltage is applied to the source region 15 or the drain region 16, the high impurity density of the channel stop region 13a would restrict the depletion region, thus lowering the durability to high voltage. However, if the impurity densities are different from each other in the elements in the memory region or the like and in the elements in the high voltage applied region, individual mask patterns are required, which increases the number of steps. In the first embodiment, the impurity densities there of are equal to each other, which increases no additional steps.

Namely, by increasing the impurity density of the channel stop region 13a of the elements required for micro-fabrication, the lowering of durability to high voltage in the element at the high voltage applied region is prevented while an excellent characteristic of elements is maintained. The buffer regions 24, 25 in the first embodiment may make the source region 15 and the drain region 16 wide. However, that involves no problems because the transistor to which normal voltage is applied does not require so micro structure.

In addition, different from the conventional techniques in FIGS. 14(a)-(d) and FIGS. 15(a)-(d), the first buffer region 24 for separating the channel stop region 13a and the drain region 16 is provided inside of the element forming region Rnfet rather than at the end part of the isolation 11, and the impurity for adjusting threshold (boron (b)) is adequately doped to the second buffer region 25 (hatched part in FIGS. 1(a)-(d) which is excluded from the gate region 17 under the gate electrode 12. Thus, leakage current between drain and source due to low impurity density of the overlap region 21 does not occur, as shown in FIGS. 14(a)-(d).

In the semiconductor device in FIGS. 15 (a)-(d), since it is required to define the overlap region 21 into the part 23 adjacent to the drain region and the part 22 adjacent to the source region, additional steps to the general method shown in FIGS. 13(a)-(e) are required for manufacturing and the mask alignment is difficult with narrow width of gate electrode. On the contrary, in the present embodiment, no additional step is required to the general method shown in FIGS. 13(a)-(e). Further, the drain region 16 at the end part of the gate electrode 12 is formed according to the self-alignment, with a result that no mask alignment is required at the gate electrode 12, avoiding the difficulty in the alignment.

In the first embodiment, both the source region 15 and the drain region 16 are separated from the channel stop region 13a, namely the buffer region 24 is provide therebetween, but the present invention is not limited to the embodiment. In detail, it is only required that at least the region to which high voltage is applied is separated from the channel stop region 13a since high voltage is applied to the drain region 16 in an ordinary semiconductor device. However, by also providing the buffer region 24 between the source region 15 and the channel stop region 13a, the same effect is displayed in a semiconductor device in which high voltage is applied to the source region 15 such as a transfer gate.

Moreover, in the first embodiment, no buffer region is provided in the p-MOSFET 2 since problems are hardly involved under a normal condition. Because, in the p-MOSFET 2, the impurity which is doped to the channel stop region 13a is phosphorus (P), which means that the P-N inversion layer is less generated such as in case of boron (B) which is comparatively easy to disperse and easy to be absorbed in a field oxide layer. Wherein, the durability to high voltage is further ensured by providing the buffer region in the p-MOSFET 2.

The first embodiment describes about a case where the source and drain are SD structure. However, the present invention is not limited to the first embodiment, and includes a case where whole region of the source region or the drain region is separated from the channel stop region in DD structure and LDD structure. The second embodiment refers to a FET in LDD structure having the above construction.

(SECOND EMBODIMENT)

The second embodiment is discussed next, with reference to FIGS. 3(a)-(d) and 4(a)-(c).

FIGS. 3(a)-(d) show a construction of CMOSFET according to the second embodiment. The parts that are different from the first embodiment are described, omitting the description of equivalent parts thereto. In the second embodiment, a side wall spacer 19 is provided at each side of the gate electrode 12. A lightly doped source region 15b and a lightly doped drain region 16b to which an impurity, i.e. phosphorus (P) and boron (B) are respectively, lightly doped in the n-MOSFET 1 and the p-MOSFET 2 are respectively formed under the side wall spacers 19, and a heavily doped source region 15a and a heavily doped drain region 16a to which an impurity, i.e. arsenic (As) and boron (B) are respectively, heavily doped in the n-MOSFET 1 and the p-MOSFET 2 are respectively formed outside of the side wall spacer 19. In the n-MOSFET 1, the heavily doped source region 15a and the heavily doped drain region 16a are separated from the channel stop region 13a, by the buffer region 24 to which the impurity for adjusting threshold, i.e. boron (B) is doped. On the contrary, in the p-MOSFET 2, both the heavily doped source region 15a and the heavily doped drain region 16a continue to the channel stop region 13a. Wherein, the impurity density near the surfaces of the lightly doped source region 15b and the lightly doped drain region 16b is $10^{18}$–$10^{19} cm^{-3}$ and that of the heavily doped source region 15a and the heavily doped drain region 16a is about $10^{20} cm^{-3}$.

Figure 4:
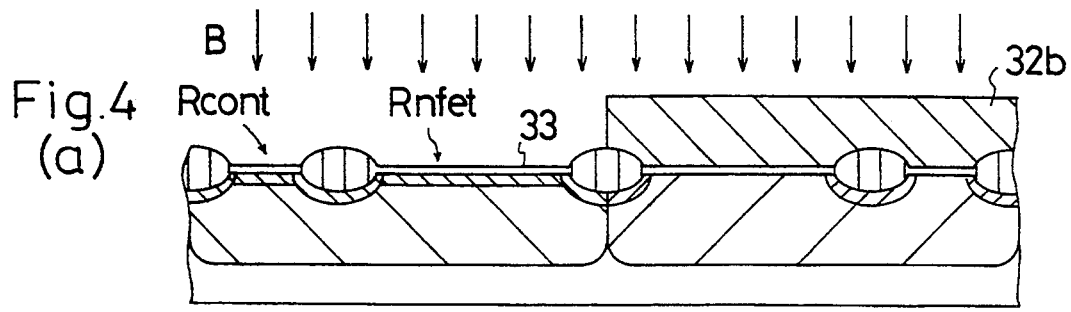
FIGS. 4(a)–(c) are respectively sections at respective steps for manufacturing the semiconductor device in the second embodiment.
Figure 4:
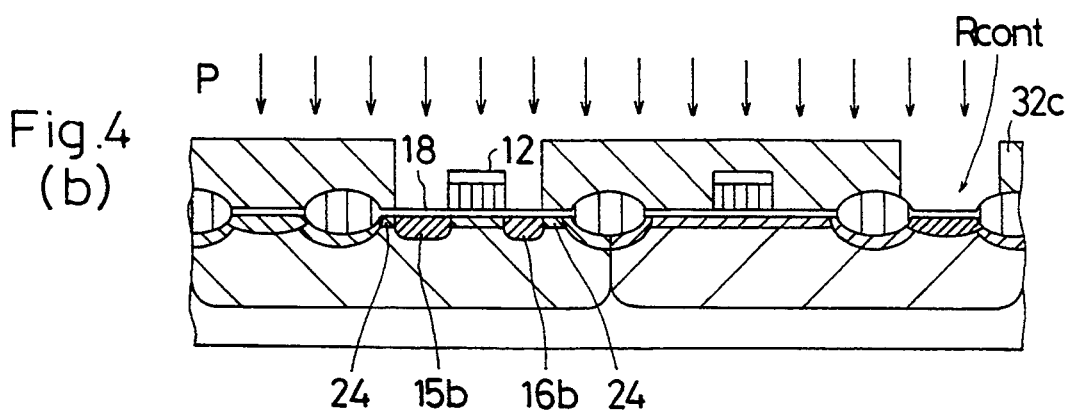
Figure 4:
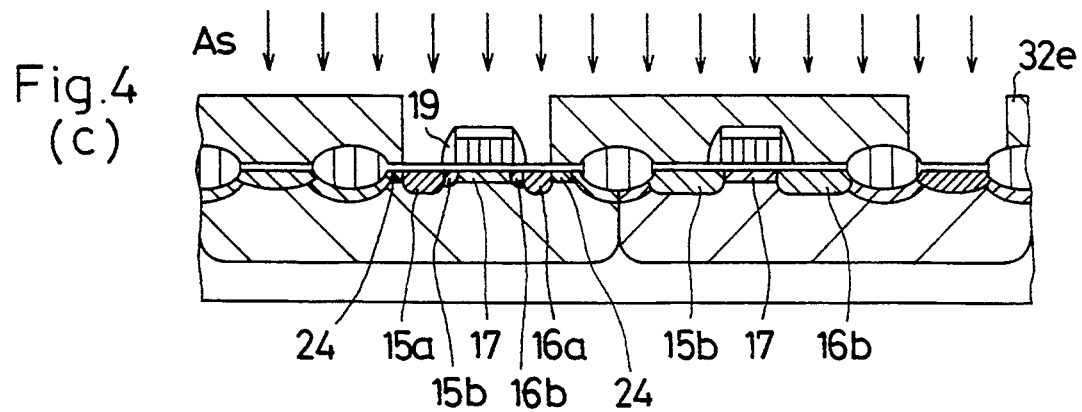

FIGS. 4(a)-(c) show a manufacturing process of the CMOS-FET according to the second embodiment. The steps of forming the isolation 11 and the channel stop region 13a are not shown but conducted in the process, as well as in FIGS. 2(a) and (b) in the first embodiment.

As shown in FIG. 4(a), the photoresist mask 32b open to only a region where the n-MOSFET 1 is to be formed (same shape as the photoresist mask 32b in FIG. 2(c) in the first embodiment) is formed on the substrate in which the isolation 11 and the channel stop region 13a are formed, and boron (B) as the impurity for adjusting threshold is implanted thereover lightly. Phosphorus (P) as the impurity for adjusting threshold is implanted in the p-MOSFET, as well.

Next, as shown in FIG. 4(b), the photoresist mask 32c having the same shape as in the FIG. 2(d) in the first embodiment is formed, and phosphorus is implanted thereover. Thereby, the lightly doped source region 15b and the lightly doped drain region 16b are respectively formed at the source and drain forming regions of the n-MOSFET 1. At this time, the impurity density near the surfaces of the lightly doped source region 15b and the lightly doped drain region 16b is about $10^{18}$–$10^{19}$cm$^{-3}$ with 20–50 KeV acceleration energy for impurity ion implant. The lightly doped source region 15b and the lightly doped drain region 16b are also formed in the p-MOSFET (not shown). Wherein, the lightly doped source region 15b and the lightly doped drain region 16b are separated from the channel stop region 13b in the n-MOSFET 1 to have, therebetween, the buffer region 24 to which the impurity for adjusting threshold is doped, and no buffer region 24 is provided in the p-MOSFET 2.

Next, as shown in FIG. 4(c), after removing the photoresist mask 32c, the side wall spacer 19 of silicon oxide layer is formed at each side of the gate electrode 12. Then, a photoresist mask 32e having the same shape as the photoresist mask 32c shown in FIG. 4(b) is formed, and arsenic (As) which is the n-type impurity is implanted thereover. Thereby, the lightly doped source region 15b and the lightly doped drain region 16b are formed adjacent to the both sides of the gate region 17 in the n-MOSFET 1, and the heavily doped source region 15a and the heavily doped drain region 16a are formed outside thereof. Namely, an LDD structure is formed. At this time, the impurity density near the surfaces of the heavily doped source region 15a and the heavily doped drain region 16a is about $10^{20}$cm$^{-3}$ or more with 20–50 KeV acceleration energy for implanting arsenic (As) ion. In this case, the buffer region 24 to which the impurity for adjusting threshold is implanted is provided between the heavily doped source and drain regions 15a, 16a and the channel stop region 13a in the n-MOSFET 1.

In the step shown in FIG. 4(c), the heavily doped source and drain regions 15a, 16a are also formed in the p-MOSFET 2, wherein the heavily doped source and drain regions 15a, 16a continue to the channel stop region 13a without such a buffer region.

Accordingly, in the second embodiment, the heavily doped source region 15a and the heavily doped drain region 16a are separated from the channel stop region 13a, thus obtaining the same effect as in the first embodiment. Especially, with the LDD structure, hot carrier effect can be effectively prevented even with short channel length for micro-fabrication.

Wherein, as well as in the first embodiment, only required is that a region to which high voltage is applied of the heavily doped source region 15a and the heavily doped drain region 16b is separated from the channel stop region 13a. The p-MOSFET 2 may have the same construction as that of the n-MOSFET 1.

In the second embodiment, the source and the drain is in the LDD structure. In DD structure, the same construction as in the second embodiment is basically obtained when the lightly doped regions are separated from the channel stop region 13a. In this case, at the step shown in FIG. 2(d) in the first embodiment, phosphorus (P) and arsenic (As) whose diffusion coefficients are different from each other are implanted, using the same photoresist mask 32c, and are diffused by heating. Thereby, a heavily doped part and a lightly doped part are relatively formed.

(THIRD EMBODIMENT)

The third embodiment is discussed next, with reference to FIGS. 5(a)–(d) and 6(a)–(c).

FIGS. 5(a)–(d) show a construction of a CMOSFET according to the third embodiment, which has basically the same construction as shown in FIGS. 3(a)–(d) in the second embodiment. Wherein, in the third embodiment, the lightly doped source and drain regions 15b, 16b to which impurity ion of inverse conductive type to the substrate is doped lightly are formed between the heavily doped source and drain regions 15a, 16a and the channel stop region 13a. In other words, the lightly doped source region 15b and the lightly doped drain region 16b function as the first buffer region 24 in the second embodiment. The second buffer region 25 is provided, as well as in the first embodiment, under the gate electrode 12 and adjacent to the isolation 11.

Figure 6:
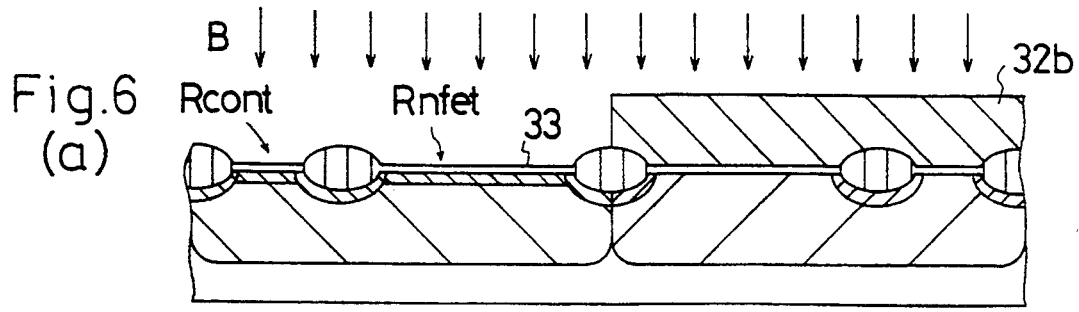
FIGS. 6(a)–(c) are respectively sections at respective steps for manufacturing the semiconductor device in the third embodiment.
Figure 6:
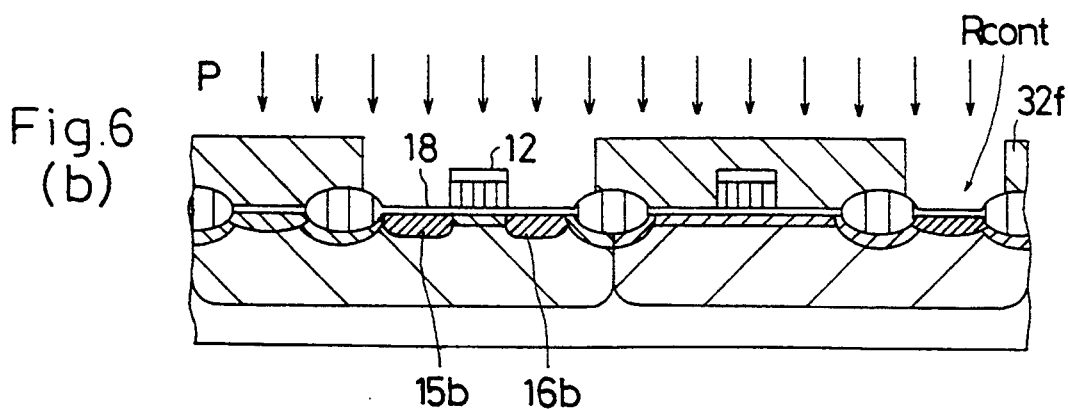
Figure 6:
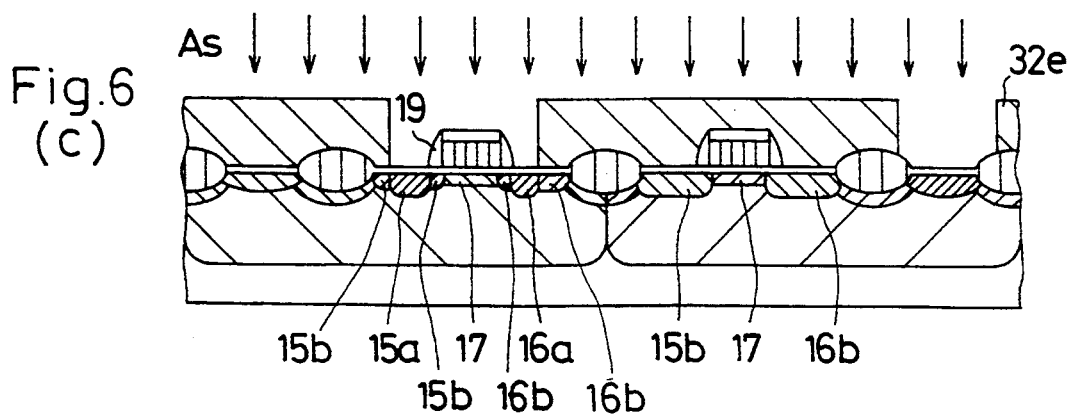

FIGS. 6(a)–(c) show a manufacturing process of the CMOSFET according to the third embodiment, wherein the same step as shown in FIG. 4(a) in the second embodiment is conducted at the step shown in FIG. 6(a).

Then, as shown in FIG. 6(b), forming a photoresist mask 32f, phosphorus (P) is implanted thereover to the source and drain forming regions in the n-MOSFET 1 to form the lightly doped source region 15b and the lightly doped drain region 16b. At this time, different from the step shown in FIG. 4(b) in the second embodiment, the photoresist mask 32f open to the end part of the isolation 11 is used, so that the channel stop region 13a continues to the lightly doped source region 15b and the lightly doped drain region 16b. Thereafter, the equivalent lightly doped source and drain regions are also formed in the p-MOSFET 2 (not shown).

After removing the photoresist mask 32f, the side wall spacer 19 is formed on each side of each gate electrode 12. Then, as shown in FIG. 6(c), the photoresist mask 32e having the same pattern as that used at the step in FIG. 4(c) in the second embodiment is formed, and arsenic (As) which is the n-type impurity is implanted thereover to form the heavily doped source region 15a and the heavily doped drain region 16a. At this time, the photoresist mask 32e covers a part set-distance inside of the element forming region Rnfet from the end of the isolation 11, thus the heavily doped source region 15a and the heavily doped drain region 16a are separated from the channel stop region 13a.

In the third embodiment, the lightly doped source region and the lightly doped drain region 16b continue to the channel stop region 13a, but the heavily doped source region 15a and the heavily doped drain region 16a are separated therefrom. Accordingly, the durability to high voltage is excellently maintained even though the impurity density of the channel stop region 13a is comparatively high.

Wherein, as well as in the first embodiment, only required is that a region to which high voltage is applied of the heavily doped source region 15a and the heavily doped drain region 16b is separated from the channel stop region 13a. The p-MOSFET 2 may have the same construction as that of the n-MOSFET 1.

In the third embodiment, the source and the drain is in the LDD structure. The same effect as with the LDD structure is displayed in case with DD structure only when the heavily doped part is separated from the channel stop region 13a, even though the drain region whose density is relatively low overlaps with the channel stop region 13a.

(FOURTH EMBODIMENT)

The fourth embodiment is described, with reference to FIGS. 7(a)–(d).

FIGS. 7(a)–(d) show a manufacturing process in case where the present invention is applied to a method of forming the heavily doped source and drain regions, using diffusion source.

Figure 7:
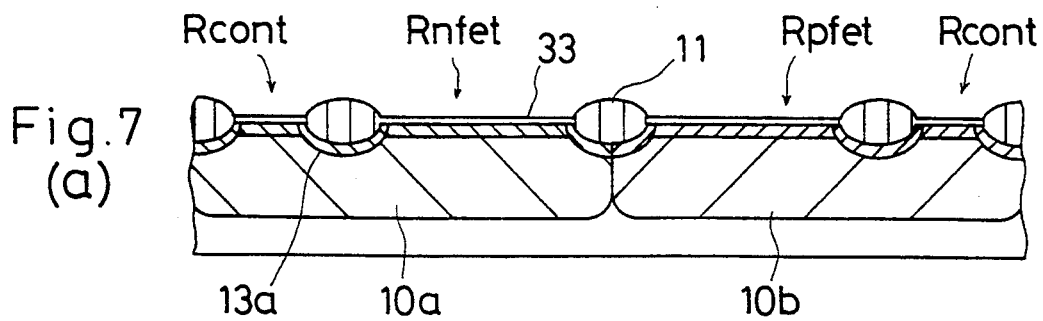
FIGS. 7(a)–(d) are respectively sections at respective steps for manufacturing the semiconductor device in the fourth embodiment.
Figure 7:
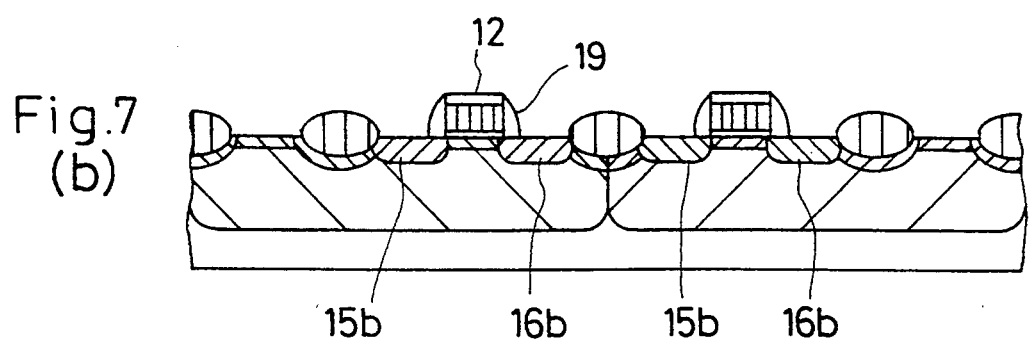
Figure 7:
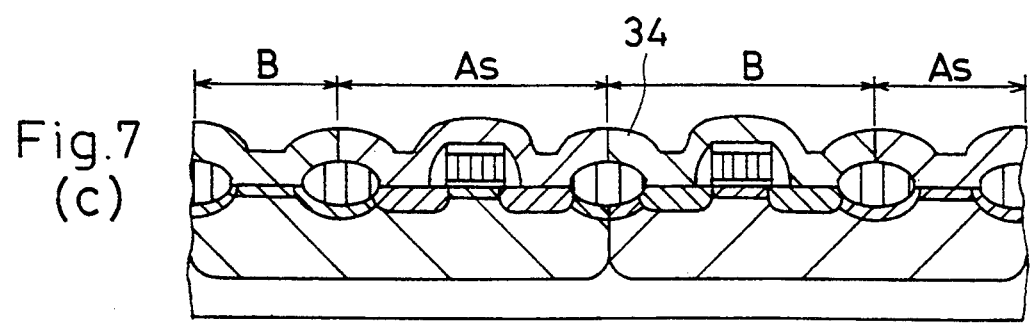
Figure 7:
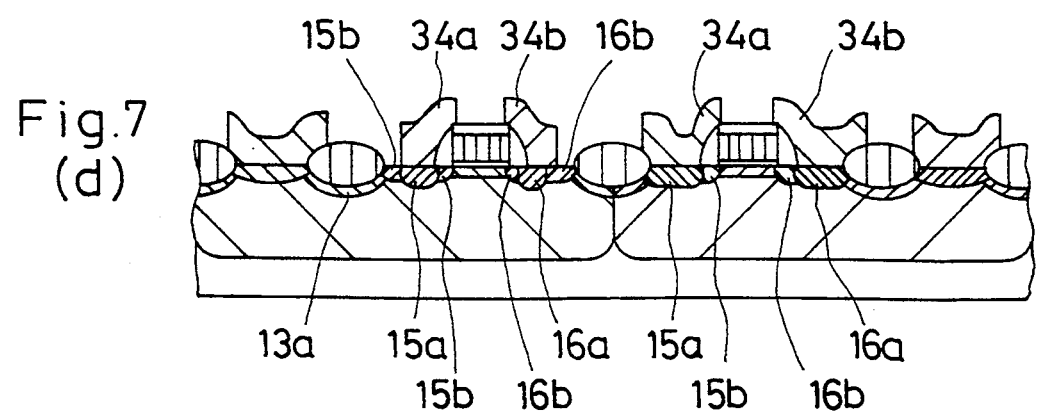

As shown in FIG. 7(a), as well as in the first to third embodiments, the P-well 10a, the N-well 10b, the isolation 11 and the channel stop region 13a are formed and the impurity for adjusting threshold is implanted.

Then, as shown in FIG. 7(b), the lightly doped source region 15b, the lightly doped drain region 16b and the side wall spacer 19 are formed according to the same step as that shown in FIG. 6(b) in the third embodiment. The oxide layers other than that under the gate electrode 12 are removed.

Then, as shown in FIG. 7(c), after a polysilicon layer 34 to be an electrode is formed over the substrate, arsenic (As) is implanted to the polysilicon on a region to which the n-type impurity is to be doped and boron (B) is implanted to the polysilicon on a region to which the p-type impurity is to be doped.

As shown in FIG. 7(d), after the polysilicon electrode is formed by patterning the polysilicon layer 34, the heavily doped source region 15a and the heavily doped drain region 16a are formed in the respective MOSFETs 1, 2 in such a manner that arsenic (As) and boron (B) are respectively diffused in the silicon substrate 10 from the respective polysilicon electrodes by maintaining a set high temperature. At this time, both ends of source electrode 34a and drain electrode 34b are patterned so as to be set-distance inside of the element forming region Rnfet from the isolation 11 in the n-MOSFET 1. Namely, the heavily doped source region 15a and the heavily doped drain region 16a are separated from the channel stop region 13a.

Hence, the same construction as shown in FIGS. 5(a)–(d) in the third embodiment is obtained in the fourth embodiment. With the above manufacturing process, the impurity is doped not so deep and punch-through is prevented.

(FIFTH EMBODIMENT)

The fifth embodiment in which the channel stop region and a punch through stop are concurrently formed is described next, with reference to FIGS. 8(a)–(d).

Figure 8:
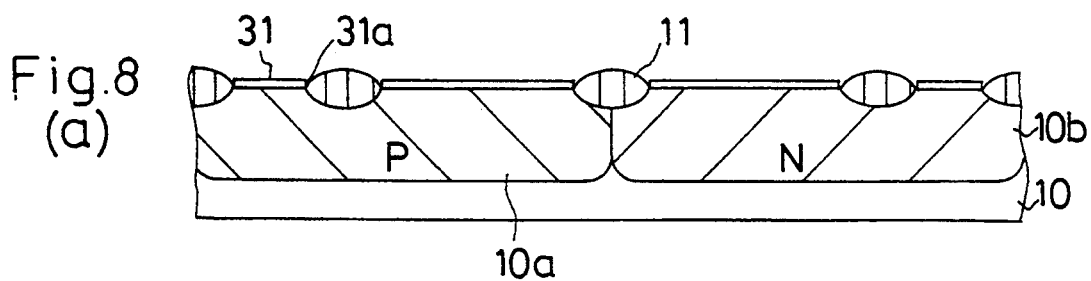
FIGS. 8(a)–(d) are respectively sections at respective steps for manufacturing the semiconductor device in the fifth embodiment.
Figure 8:
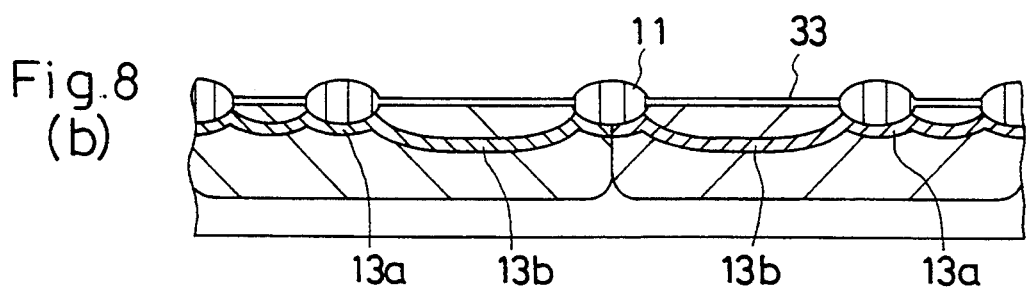
Figure 8:
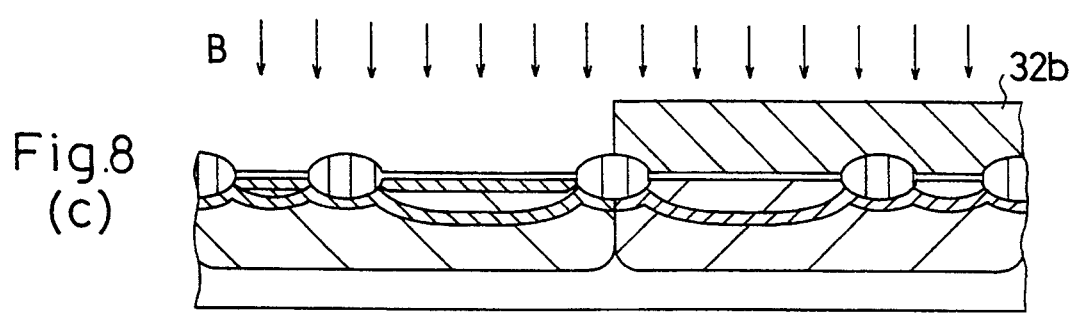
Figure 8:
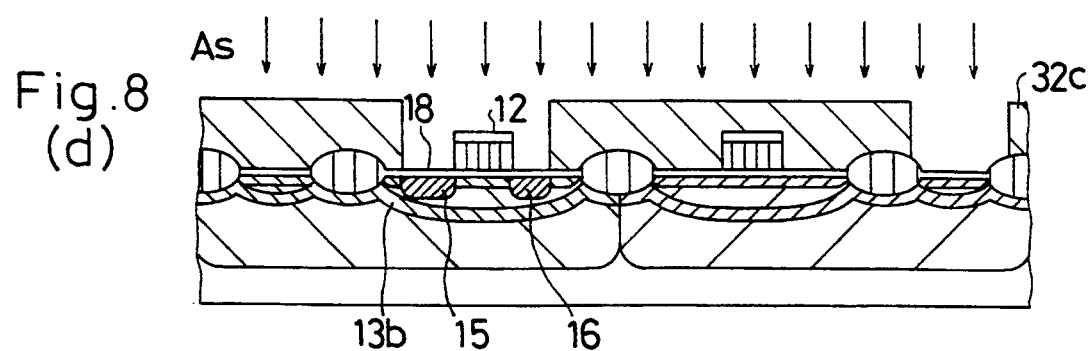

As shown in FIG. 8(a), after deposition and patterning of the silicon nitride layer 31 on the silicon substrate 10, the isolation 11 of LOCOS is formed by thermal-oxidation of silicon at the open part 31a thereof.

Then, as shown in FIG. 8(b), an impurity ion is implanted thereover to the depth of several-hundred nanometer from the surface of the silicon with relatively high energy, thus forming concurrently form the channel stop region 13a and a punch-through stop region 13b. Wherein, the implanted impurity is boron (B) in the n-MOSFET 1 and phosphorus (P) in the p-MOSFET 2.

The impurity for adjusting threshold is implanted as shown in FIG. 8(c) and the gate electrode 12 is formed as shown in FIG. 8(d). Then, the source region 15 and the drain region 16 are formed by implanting the impurity having high density. The steps shown in FIGS. 8(c) and (d) are basically the same as those in FIGS. 2(c) and (d) in the first embodiment. Both the source region 15 and the drain region 16 are located set-distance inside of the element forming region Rnfet from the isolation 11 and are separated from the channel stop region 13a. Further, the source region 15 and the drain region 16 are separated from the punch-through stop region 13b in this embodiment.

Figure 9A:
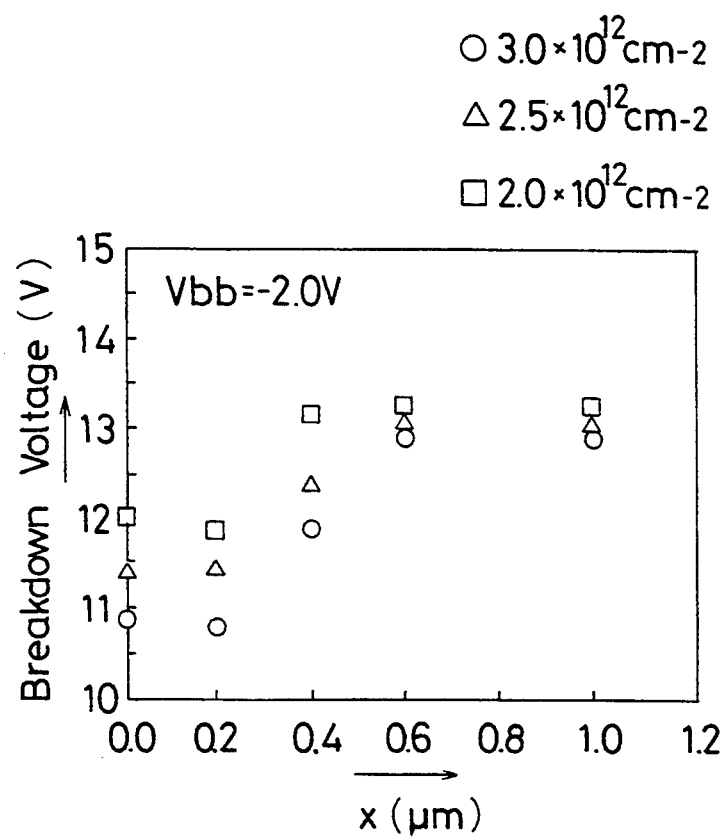
FIG. 9(a) is a graph showing a variation of durability to voltage with respect to overlap width of an element forming region and a mask.
Figure 9B:
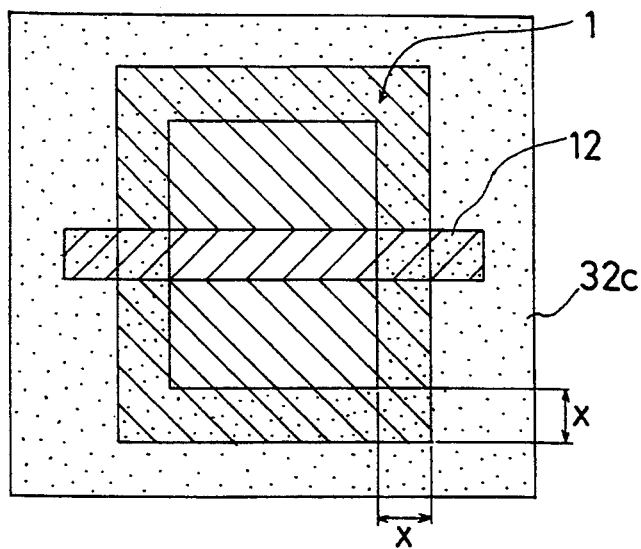
FIG. 9(b) is a plan view showing the overlap of the element forming region and the mask in FIG. 9(a).

FIG. 9(a) shows measured results of breakdown voltage at voltage application to the drain of the n-MOSFET fabricated with varying a width X (refer to FIG. 9(b) where the mask 32c in the step in FIG. 8(d) and the end part of the element forming region overlap each other. In FIG. 9(a), a white circle, a white triangle and a white square indicate respectively data that respective doses of the impurity ion doped to the channel stop region 13a and the punch-through stop region 13b are $3.0 \times 10^{12} cm^{-2}$, $2.5 \times 10^{12} cm^{-2}$ and $2.0 \times 10^{12} cm^{-2}$, wherein the acceleration energy of boron (B) is 170 KeV. As shown in FIG. 9(a), by setting the overlap width X between the mask 32c and the element forming region to 0.4–0.6 μm, the durability to high voltage is improved by 1–2 V. Under the condition of implanting impurity ion in this case, the impurity density near the surface of the channel stop region 13a can be completely $1 \times 10^{17} cm^{-3}$.

In the fifth embodiment, the punch-through stop region 13b effectively prevents the punch-through between the source and the drain while maintaining the durability to high voltage excellently. In addition, since the punch-through stop region 13b is formed at the same time as the formation of the channel stop region 13a, the manufacturing process is simplified.

(SIXTH EMBODIMENT)

The sixth embodiment, in which the present invention is applied to a MOSFET having a step-up transformer, is discussed with reference to FIGS. 10 and 11(a)–(e).

Figure 10:
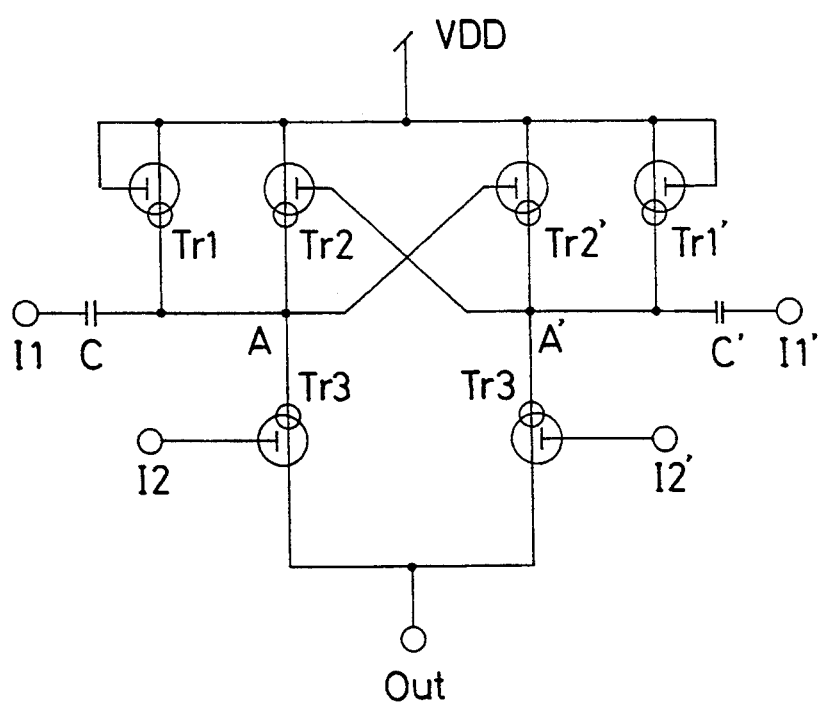
FIG. 10 is a circuit diagram showing a step-up transformer in a sixth embodiment.
Figure 12:
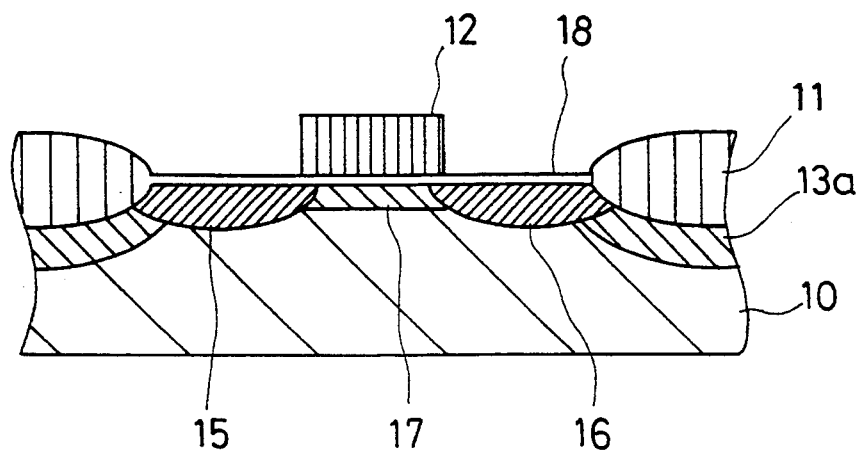
FIG. 12 is a section showing a construction of a vicinity of a FET of a conventional semiconductor device.
Figure 13A:
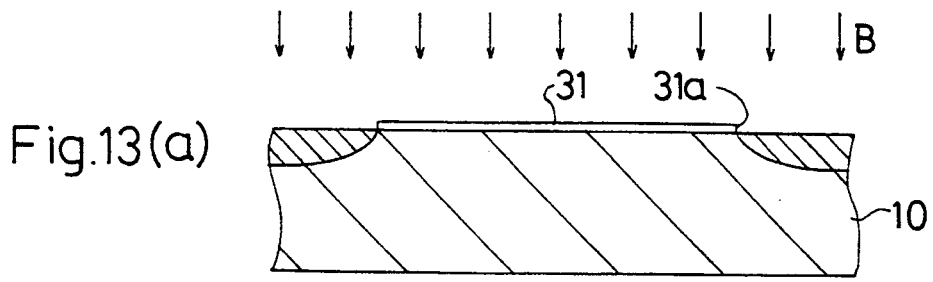
FIGS. 13(a)–(e) are respectively sections at respective steps of manufacturing a conventional semiconductor device.
Figure 13B:
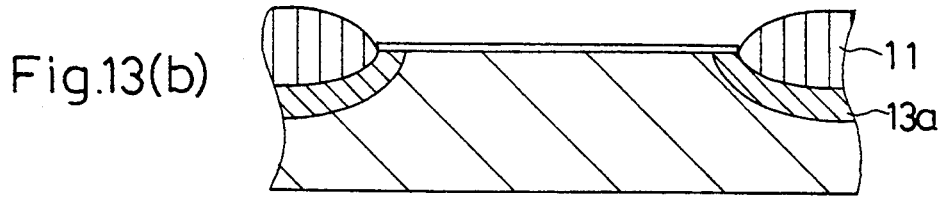
Figure 13C:
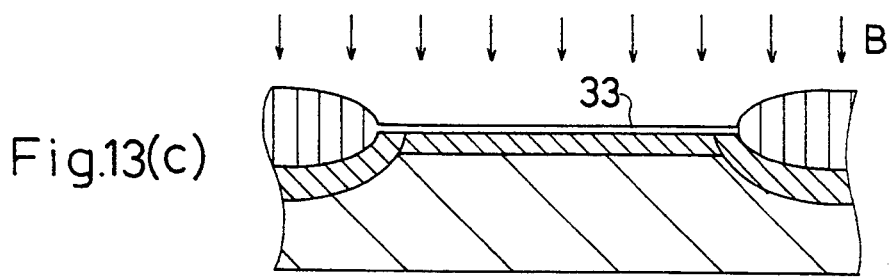
Figure 13D:
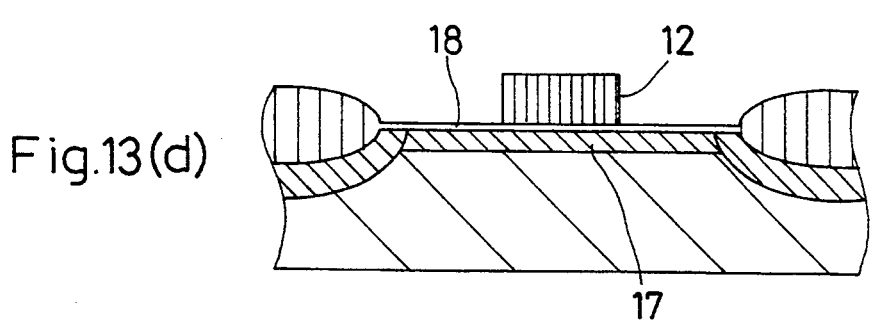
Figure 13E:
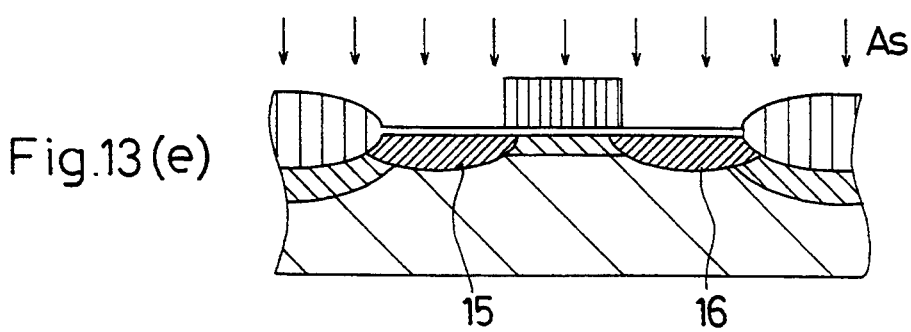
Figures 15A, 15B:
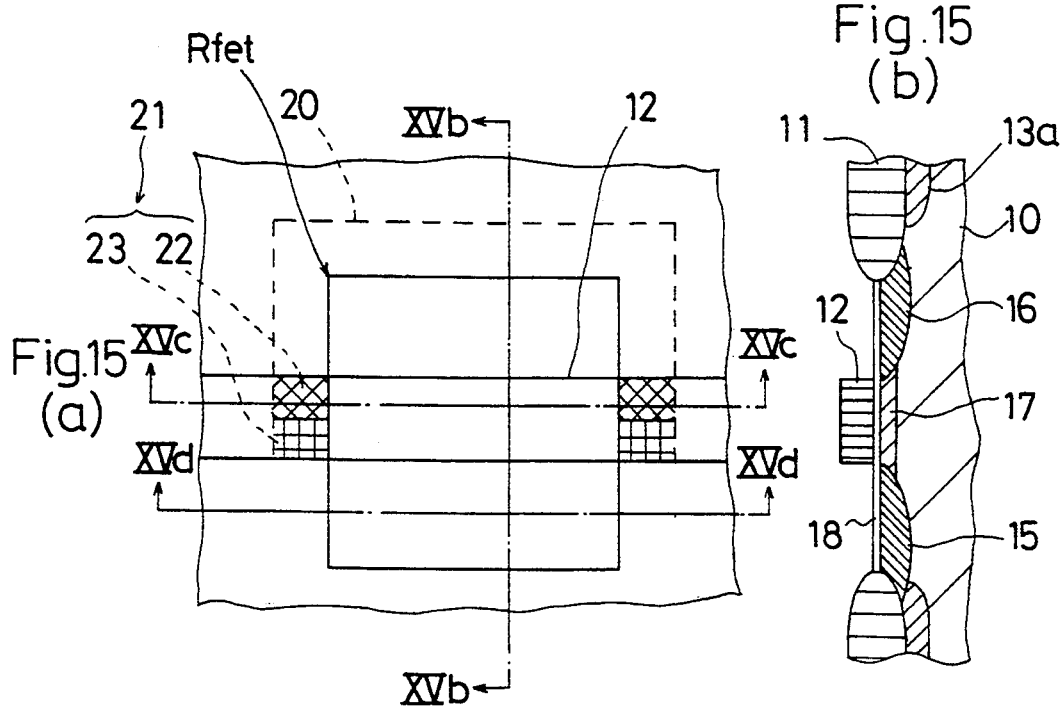
FIG. 15(a) is a plan view showing a vicinity of a FET of a conventional semiconductor device disclosed in another reference.
FIGS. 15(b)-(d) are respectively sections taken along lines XVb—XVb, XVc—XVc and XVd—XVd in FIG. 15(a).
Figure 15C:
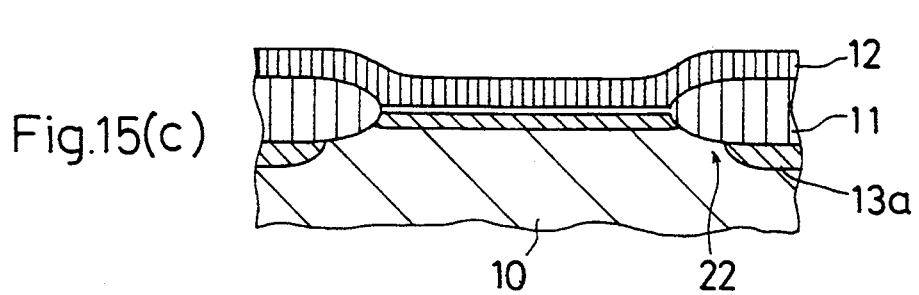
Figure 15D:
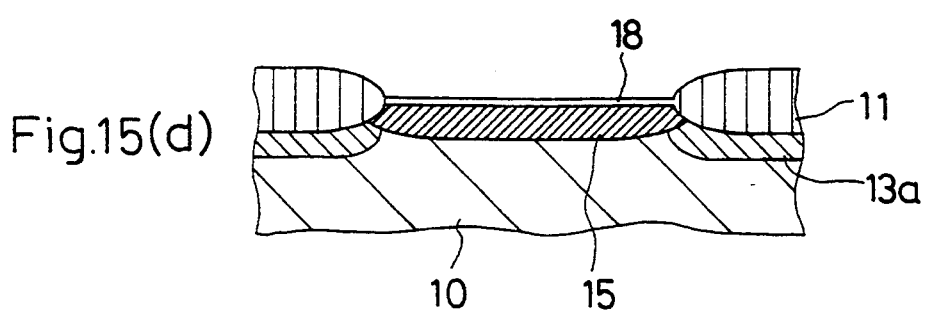

FIG. 10 is a circuit diagram of a step-up transformer, and FIGS. 11(a)–(e) show potential waveforms at terminals I1, I1', points A, A' and a terminal Out shown in FIGS. 8(a)–(d). Wherein, in FIG. 10, Tr1, Tr2, Tr3, Tr1', Tr2', Tr3' indicate transistors, and C and C' indicate capacitors. In each transistor Tr1–Tr3', a side of the white circle out of the source and the drain is separated from the channel stop region.

When a voltage signal in pulse of VDD height is applied to the terminal I1' as shown in FIG. 11(a), the potential at the point A is drawn up to not less than VDD of pulse voltage for coupling in the capacitor C, as shown in FIG. 11(c). At this time, when the gate voltage is applied to the terminal I1', the transistor Tr3 is in ON state to transmit the potential to the terminal Out. Since fall of the pulse voltage from the terminal I1 pulls down the potential at the point A, the transistor Tr3 is in OFF state.

Meanwhile, a pulse voltage signal of inverse phase to that of the terminal I1 is applied to the terminal I1' as shown in FIG. (b), and the potential at the point A' is drawn up to not less than VDD of pulse voltage to transmit the potential to the terminal Out via the transistor Tr3', as shown in FIG. 11(d).

Namely, since the voltage signal not less than the pulse voltage VDD is transmitted alternatively from the transistors Tr3, Tr3' to the terminal Out, the potential at the terminal Out is high voltage not less than VDD as shown in FIG. 11(e).

In the sixth embodiment, the transistor arranged at a portion to which the high voltage about 10–11 V is applied has a construction that the channel stop region and the source region or the drain region is separated from each other as in the first to fifth embodiments, thus the characteristic of step-up transformer is excellently maintained. Wherein only required is that at least a region to which the high voltage is applied of the source region and the drain region is separated from the channel stop region.

In the sixth embodiment, the example that the transistors having a construction having high durability to high voltage as in the first to fifth embodiments are arranged in the step-up transformer. However, the present invention is not limited to the embodiment, and the function is displayed fully only when the circuit generates high bias.

We claim:

1. A semiconductor device having a FET in an element forming region of a semiconductor substrate to which an impurity of a first conductive type is doped, comprising:
   a gate electrode of the FET which is formed on the semiconductor substrate;
   a source region and a drain region of the FET, doped with an impurity of a second conductive type, respectively provided under both sides of the gate electrode in the semiconductor substrate;
   a main channel region of the FET, comparatively lightly doped with an impurity of the same conductive type as the substrate, provided under the gate electrode between the source region and the drain region in the semiconductor;
   an isolation formed around the element forming region on the semiconductor substrate so as to isolate the element forming region from other regions;
   a channel stop region, comparatively heavily doped with an impurity of the first conductive type, formed under the isolation in the semiconductor substrate;
   a first buffer region, doped with an impurity of the same conductive type and the same density as that of the main channel region, formed between the channel stop region and at least a region to which a high voltage is applied of the drain region and source region in the semiconductor substrate; and
   a second buffer region, doped with an impurity of the same conductive type and the same density as the main channel region, formed under the gate electrode in the semiconductor substrate between the isolation and the main channel region.

2. The semiconductor device according to claim 1, wherein the first buffer region is provided between the channel stop region and both the drain region and the source region in the semiconductor substrate.

3. The semiconductor device according to claim 1, further comprising a step-up transformer having a high potential part, wherein the high potential part of the step-up transformer is connected to the source region or the drain region of the FET which is separated from the channel stop region by the first buffer region.

4. A semiconductor device having a FET in an element forming region of a semiconductor substrate to which an impurity of a first conductive type is doped, comprising:
   a gate electrode of the FET which is formed on the semiconductor substrate;
   a side wall spacer located at each side of the gate electrode;
   a lightly doped source region and a drain region of the FET each lightly doped with an impurity of a second conductive type and formed at a region under the side wall spacer in the semiconductor substrate;
   a source region and a drain region of the FET each heavily doped with an impurity of a second conductive type and respectively formed at a region outside of and adjacent to the lightly doped source region and the lightly doped drain region;
   a main channel region of the FET which is provided under the gate electrode between the lightly doped source region and the lightly doped drain region in the semiconductor, said main channel region comparatively lightly doped with an impurity of the same conductive type as the substrate;
   an isolation formed around the element forming region on the semiconductor substrate so as to separate the element forming region from other regions;
   a channel stop region, comparatively heavily doped with an impurity of the first conductive type, formed under the isolation in the semiconductor substrate;
   a first buffer region formed between the channel stop region and at least a region to which a high voltage is applied of the heavily doped drain region and the heavily doped source region in the semiconductor substrate, the first buffer region being doped with an impurity of the opposite conductive type as said lightly doped source and drain regions having a density approximately equal to that of the lightly doped source region and the lightly doped drain region; and
   a second buffer region formed under the gate electrode in the semiconductor substrate and between the isolation and the main channel region, said second buffer region being doped with, an impurity of the same conductive type and the same density as that of the main channel region.

5. The semiconductor device according to claim 4, wherein the first buffer region is located between the channel stop region and the heavily doped source region and the heavily doped drain region in the semiconductor substrate.

6. The semiconductor device according to claim 4, further comprising a step-up transformer having a high potential part, wherein the high potential part of the step-up transformer is connected to the heavily doped source region or the heavily doped drain region of the FET which is separated from the channel stop region by the first buffer region.

7. The semiconductor device according to claims 1 or 2, further comprising a punch-through stop region formed under the element forming region of the semiconductor substrate continuing to the channel stop region and separating the punch-through stop region from at least a region to which a high voltage is applied of the source region and the drain region, wherein the punch-through stop region is doped with an impurity of the first conductive type having a density approximately equal to that of the channel stop region.

8. The semiconductor device according to claims 4 or 5, further comprising a punch-through stop region formed under the element forming region of the semiconductor substrate continuing to the channel stop region and separating the punch-through stop region from at least a region to which a high voltage is applied of the heavily doped source region and the heavily doped drain region, wherein the punch-through stop region is doped with an impurity of the first conductive type having a density approximately equal to that of the channel stop region.

9. A method of manufacturing a semiconductor device having an isolation for isolating an element forming region from other regions and a FET composed of a gate electrode, a source region and a drain region in an element forming region of a semiconductor substrate to which an impurity of a first conductive type is doped, comprising the steps of:

heavily doping an impurity of a first conductive type to a region where the isolation of the semiconductor substrate is to be formed to form a channel stop region;

forming an insulating film to be the isolation at the isolation forming region on the semiconductor substrate;

doping an impurity of the first conductive type to the substrate to a density of threshold adjusting level to the element forming region;

forming the gate electrode of the FET on the element forming region; and forming the source region and the drain region of the FET by doping an impurity of a second conductive type to both sides of the gate electrode of the element forming region, wherein the step of forming the drain region and the source region is conducted so that at least a region to which a high voltage is applied of the drain region and the source region is formed a set-distance inside of the element forming region from an end part of the isolation, separating the drain region and source region from a channel stop region.

10. The method of manufacturing a semiconductor device according to claim 9, wherein the semiconductor device includes an n-channel FET and a p-channel FET, and the step of forming the source region and the drain region is conducted so that at least a region to which a high voltage is applied of the source region and the drain region is separated from the channel stop region in an element forming region of the n-channel FET and the source region and the drain region are overlapped with the channel stop region in an element forming region of the p-channel FET.

11. The method of manufacturing a semiconductor device according to claim 9, wherein the semiconductor device includes an n-channel FET and a p-channel FET, and the step of forming the source region and the drain region is conducted so that in both element forming regions of the n-channel FET and the p-channel FET at least a region to which a high voltage is applied of the drain regions and the source regions is separated from the channel stop region.

12. The method of manufacturing a semiconductor device according to claim 9, 10 or 11, wherein at the step of forming the drain region and the source region, in the source region or the drain region which is separated from the channel stop region, an impurity ion is implanted using, as masks, the gate electrode and a photoresist mask open a set-distance inside of the element forming region from the isolation, then is diffused.

13. The method of manufacturing a semiconductor device according to claim 9, 10 or 11, wherein at the step of forming the drain region and the source region, in the source region or the drain region which is separated from the channel stop region, an electrode, made of a conductive material, to which an impurity ion is doped is formed on a region where the impurity ion is to be doped, then the impurity ion is diffused from the electrode into the semiconductor substrate by heating.

14. A method of manufacturing a semiconductor device having an isolation for isolating the element forming region from other regions and a FET composed of a gate electrode, a lightly doped source region, a lightly doped drain region, a heavily doped source region and heavily doped drain region in an element forming region of a semiconductor substrate to which an impurity of a first conductive type is doped, comprising the steps of:

doping an impurity for forming a channel stop to a region where the isolation of the semiconductor substrate is to be formed;

forming an insulating film to be the isolation at the isolation forming region on the semiconductor substrate;

doping an impurity of the first conductive type to that of the semiconductor substrate to a density of threshold adjusting level to the element forming region;

forming the gate electrode of the FET on the element forming region;

doping lightly an impurity of a second conductive type to a region at both sides of the gate electrode of the element forming region;

forming a side wall spacer on each side of the gate electrode of the FET; and forming the heavily doped source region and the heavily doped drain region by heavily doping an impurity of the second conductive type on the side of the side wall spacer of the element forming region after the formation of the side wall spacer of the gate electrode, wherein the step of forming the heavily doped source region and the heavily doped drain region is conducted so that a region to which a high voltage is applied of the heavily doped source region and the heavily doped drain region is formed a set-distance inside of the element forming region from the end part of the isolation, separating the drain region and the source region from the channel stop region.

15. The method of manufacturing a semiconductor device according to claim 14,.

wherein the semiconductor device includes an n-channel FET and a p-channel FET, and the step of forming the heavily, doped source region and the heavily doped drain region is conducted so that at least a region to which a high voltage is applied of the heavily doped source region and the heavily doped drain region is separated from the channel stop region in the element forming region of the n-channel FET and the heavily doped source region and the heavily doped drain region are overlapped with the channel stop region in the element forming region of the p-channel FET.

16. The method of manufacturing a semiconductor device according to claim 14, wherein the semiconductor device includes an n-channel FET and a p-channel FET, and the step of forming the heavily doped source region and the heavily doped drain region is conducted so that in the element forming regions of the n-channel FET and the p-channel FET, at least a region to which a high voltage is applied of the heavily doped drain region and the heavily doped source region is separated from the channel stop region.

17. The method of manufacturing a semiconductor device according to claim 14, 15 or 16, wherein at the step of forming the heavily doped source region and the heavily doped drain region, in the heavily doped source region or the heavily doped drain region which is separated from the channel stop region, an impurity ion is implanted using, as masks, the gate electrode and a photoresist mask open a set-distance inside of the element forming region from the isolation, then is diffused.

18. The method of manufacturing a semiconductor device according to claim 14, 15 or 16, wherein at the step of forming the heavily doped source region and the heavily doped drain region, in the heavily doped source region or the heavily doped drain region which is separated from the channel stop region, an electrode, made of a conductive material, to which an impurity ion is doped is formed on a region where the impurity ion is to be doped, then the impurity ion is diffused from the electrode into the semiconductor substrate by heating.

19. The method of manufacturing a semiconductor device according to claims 9 or 14, wherein the step of doping the impurity for forming the channel stop region includes implanting an impurity ion over the element forming region and the isolation using high energy after forming the isolation, and at the same time implanting the impurity ion under the element forming region of the semiconductor substrate as an impurity for forming a punch-through stop region.

20. A semiconductor device having a FET of the buried channel region type in an element forming region of a semiconductor substrate to which an impurity of a first conductive type is doped, comprising:

a gate electrode of the FET which is formed on the semiconductor substrate;

a source region and a drain region of the FET, doped with an impurity of a second conductive type, respectively provided under both sides of the gate electrode in the semiconductor substrate;

a main channel region of the FET, comparatively lightly doped with an impurity of the opposite conductive type as the substrate, provided under the gate electrode between the source region and the drain region in the semiconductor;

an isolation formed around the element forming region on the semiconductor substrate so as to isolate the element forming region from other regions;

a channel stop region, comparatively heavily doped with an impurity of the first conductive type, formed under the isolation in the semiconductor substrate;

a first buffer region, doped with an impurity of the same conductive type and the same density as that of the main channel region, formed between the channel stop region and at least a region to which a high voltage is applied of the drain region and source region in the semiconductor substrate; and a second buffer region, doped with an impurity of the same conductive type and the same density as the main channel, formed under the gate electrode in the semiconductor substrate between the isolation and the main channel region.

21. The semiconductor device according to claim 1, wherein the element forming region is a well included in the substrate, said well having an impurity of the opposite conductive type of the main channel region.

* * * * *